(12) United States Patent
Nakagawa et al.

(10) Patent No.: US 7,943,001 B2
(45) Date of Patent: May 17, 2011

(54) PROCESS FOR PRODUCING MULTILAYER BOARD

(75) Inventors: Takashi Nakagawa, Kawasaki (JP); Seiichi Sugano, Kawasaki (JP); Kenji Iida, Kawasaki (JP); Yasutomo Maehara, Kawasaki (JP); Hitoshi Suzuki, Kawasaki (JP); Kaoru Sugimoto, Kawasaki (JP); Kenji Fukuzono, Kawasaki (JP); Takashi Kanda, Kawasaki (JP); Hiroaki Date, Kawasaki (JP); Tomohisa Yagi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 376 days.

(21) Appl. No.: 11/649,203

(22) Filed: Jan. 4, 2007

(65) Prior Publication Data

US 2007/0289706 A1    Dec. 20, 2007

(30) Foreign Application Priority Data

Jun. 16, 2006    (JP) ................. 2006-166995

(51) Int. Cl.
*H04K 3/34*    (2006.01)
(52) U.S. Cl. ......................... 156/290; 29/825
(58) Field of Classification Search .......... 156/290; 29/825
See application file for complete search history.

(56) References Cited

U.S. PATENT DOCUMENTS

| | | | |
|---|---|---|---|
| 4,157,932 A * | 6/1979 | Hirata ............................ | 156/310 |
| 6,138,348 A * | 10/2000 | Kulesza et al. ................. | 29/840 |
| 6,238,599 B1 * | 5/2001 | Gelorme et al. ............... | 252/514 |
| 6,358,630 B1 * | 3/2002 | Tsukada et al. ............... | 428/646 |
| 7,467,742 B1 | 12/2008 | Gelorme et al. ......... | 228/180.21 |
| 2002/0004352 A1 * | 1/2002 | Haas et al. ..................... | 442/394 |
| 2005/0017740 A1 | 1/2005 | Higashitani et al. | |

FOREIGN PATENT DOCUMENTS

| | | |
|---|---|---|
| EP | 1 478 023 A1 | 11/2004 |
| JP | 11-163522 | 6/1999 |
| JP | 2000003987 A * | 1/2000 |
| JP | 2001220691 A * | 8/2001 |
| JP | 2003-243797 | 8/2003 |
| JP | 2004363220 A * | 12/2004 |

OTHER PUBLICATIONS

Jia, Songliang "Electronic Assembly Fabrication—Chip, Circuit Board, Package and Components," translated by Harper, Charles, A., Science Press, Feb. 28, 2005, pp. 17-18.
English Translation of the Chinese Office Action dated Aug. 28, 2009.

* cited by examiner

*Primary Examiner* — Jeff H Aftergut
*Assistant Examiner* — Jaeyun Lee
(74) *Attorney, Agent, or Firm* — Kratz, Quintos & Hanson, LLP (57) ABSTRACT

A process for producing a multilayer board includes the steps of applying a bonding ink to the terminal of the first substrate, the bonding ink including a thermosetting resin containing a filler and a curing agent, the filler being formed of metal particles plated with solder, the metal particles each having a first melting point, and the solder having a second melting point lower than the first melting point; bonding the second substrate to a bonding sheet composed of a thermosetting resin and having a through hole disposed in a portion corresponding to the terminal of the second substrate; and heating and pressurizing the first and second substrates with the bonding sheet in such a manner that the terminals are opposite each other to effect curing of the bonding sheet and the bonding ink and to form an integral structure.

4 Claims, 6 Drawing Sheets

PROCESS FOR PRODUCING MULTILAYER BOARD

BACKGROUND OF THE INVENTION

1. Field of the Invention

The present invention relates to a process for producing a multilayer board.

2. Description of the Related Art

Examples of methods for electrically connecting multilayer wiring boards includes a method in which a multilayer wiring board is packaged to form a ball grid array (BGA) package or a land grid array (LGA) package, and the resulting package is connected to a motherboard with solder bumps; and a method of electrically connecting a multilayer wiring board using wire bonding or stud bumps. Furthermore, Japanese Unexamined Patent Application Publication No. 2003-243797 disclose a method of electrically connecting multilayer wiring boards by fixing them with steady pins to bring terminals into contact with each other.

SUMMARY OF THE INVENTION

In the method of electrically connecting the multilayer wiring boards by fixing them with steady pins to bring the terminals into mechanical contact with each other, low-reliability joint surface is disadvantageously obtained because of variations in dimensions of the steady pins, other jigs, and assembly components. Furthermore, manual assembly is disadvantageously required, thus increasing the number of steps.

Accordingly, the present invention was accomplished to overcome the problems. It is an object of the present invention to provide a process for easily producing a multilayer board including strongly bonded substrates.

To achieve the object, the present invention provides the following process.

That is, in a process according to an aspect of the present invention for producing a multilayer board including a first substrate having a terminal, a second substrate having a terminal, an insulating layer, and a conductive member, the first substrate being bonded to the second substrate with the insulating layer provided therebetween, the terminals being opposite each other and being electrically connected with the conductive member, the process includes the steps of applying a bonding ink to the terminal of the first substrate, the bonding ink including a thermosetting resin containing a filler and a curing agent, the filler being formed of metal particles plated with solder, the metal particles each having a first melting point, and the solder having a second melting point lower than the first melting point; bonding the second substrate to a bonding sheet composed of a thermosetting resin and having a through hole disposed in a portion corresponding to the terminal of the second substrate in such a manner that the terminal is located in the through hole; positioning the first substrate and the second substrate in such a manner that the terminals are opposite each other and laminating the first substrate and the second substrate with the bonding sheet provided therebetween; and heating and pressuring the resulting laminate to effect curing of the bonding sheet and the bonding ink to form an integral structure.

It is preferred that the first substrate be a motherboard, and the second substrate have a size smaller than that of the motherboard and be at least one mounting board.

Alternatively, it is preferred that the second substrate be a motherboard, and the first substrate have a size smaller than that of the motherboard and be at least one mounting board.

In a process according to another aspect of the present invention for producing a multilayer board including a first substrate having a terminal, a second substrate having a terminal, an insulating layer, and a conductive member, the first substrate being bonded to the second substrate with the insulating layer provided therebetween, the terminals being opposite each other and being electrically connected with the conductive member, the process includes the steps of bonding the first substrate to a bonding sheet composed of a thermosetting resin and having a through hole disposed in a portion corresponding to the terminal of the first substrate in such a manner that the terminal is located in the through hole; filling the through hole with a bonding ink in such a manner that the terminal is covered with the bonding ink, the bonding ink including a thermosetting resin containing a filler and a curing agent, the filler being formed of metal particles plated with solder, the metal particles each having a first melting point, and the solder having a second melting point lower than the first melting point; positioning the first substrate and the second substrate in such a manner that the terminals are opposite each other and laminating the first substrate and the second substrate with the bonding sheet provided therebetween; and heating and pressuring the resulting laminate to effect curing of the bonding sheet and the bonding ink to form an integral structure.

It is preferred that the first substrate be a motherboard, and the second substrate have a size smaller than that of the motherboard and be at least one mounting board.

Alternatively, it is preferred that the second substrate be a motherboard, and the first substrate have a size smaller than that of the motherboard and be at least one mounting board.

In the present invention, as described above, by heating and pressurizing the laminate, the solder of the filler in the bonding ink melts to form an integral structure, resulting in strong bonding to terminals. Thus, columnar conductive member is formed, thereby resulting in appropriate electrical properties. Moreover, even when substrates having different thermal expansion coefficients are used, the electrical interconnection between terminals of the substrates is ensured because of high bonding strength, thereby improving connection reliability. Furthermore, since the substrates do not include an electronic component such as a semiconductor chip, it is possible to perform the step of heating and pressurizing the laminate to effect curing of the bonding ink in the production process of the multilayer board, thereby strongly connecting the terminals.

DESCRIPTION OF THE PREFERRED EMBODIMENTS

Preferred embodiments of the present invention will be described in detail with reference to the drawings.

FIGS. 1 to 6 illustrate various structures of a multilayer board 10.

The term "substrate" means a multilayer wiring substrate not containing an electronic component, such as a semiconductor chip, a resistor, or a capacitor.

Figure 1:
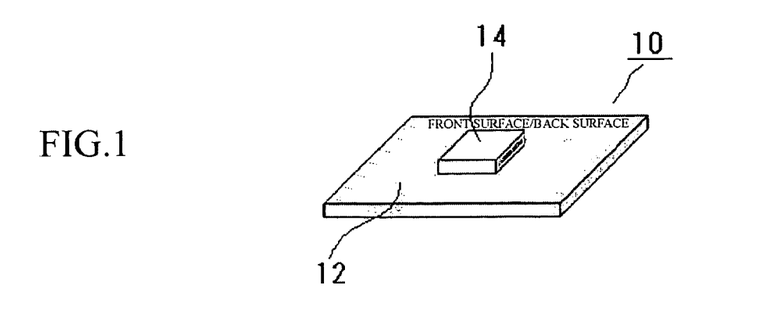
FIG. 1 illustrates a multilayer board having a structure in which a second substrate is laminated on a first substrate, the second substrate being smaller than the first substrate.
Figure 2:
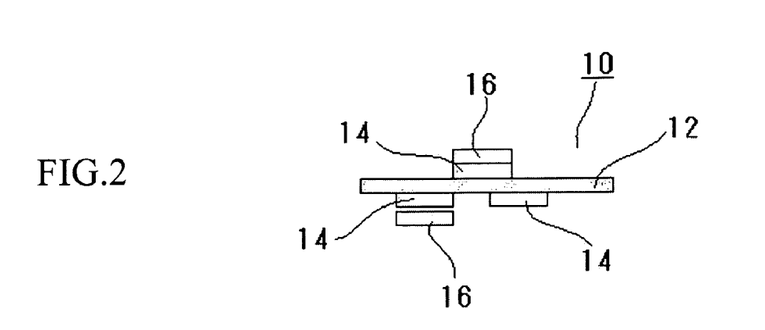
FIG. 2 illustrates a multilayer board having a structure in which second substrates are laminated on a first substrate, and third substrates are laminated on the second substrates, the second substrates each being smaller than the first substrate.

FIG. 1 shows an example of the multilayer board 10 having a structure in which a second substrate (mounting board) 14 is disposed on a first substrate (motherboard) 12, the second substrate 14 having a size smaller than that of the first substrate 12. At least one second substrate 14 is disposed on the front surface or the back surface of the first substrate 12. Furthermore, as shown in FIG. 2, third substrates 16 may be disposed on the second substrates 14.

When the second substrate 14 is defined as a first substrate, the third substrate 16 is defined as a second substrate with respect to the second substrate 14. In the present invention, one substrate of a pair of substrates is referred to as a first substrate, and the other is referred to as a second substrate. In the case of a multilayer board having three or more of layers, if adjacent substrates therein are produced by a process according to an aspect of the present invention, the multilayer board is included in the range of the present invention.

Figure 3:
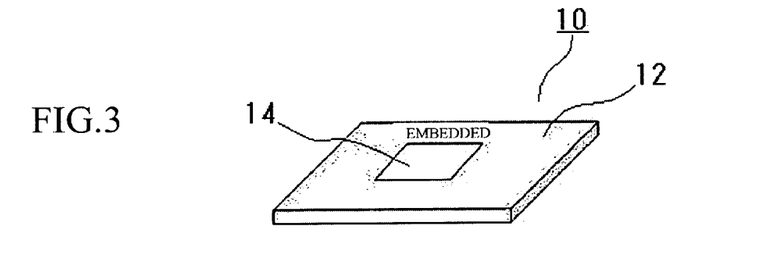
FIG. 3 illustrates a multilayer board having a structure in which a second substrate is embedded in a first substrate.

FIG. 3 shows an example of the multilayer board 10 having a structure in which the at least one second substrate 14 is embedded in the front side and/or back side of the first substrate 12.

Figure 4:
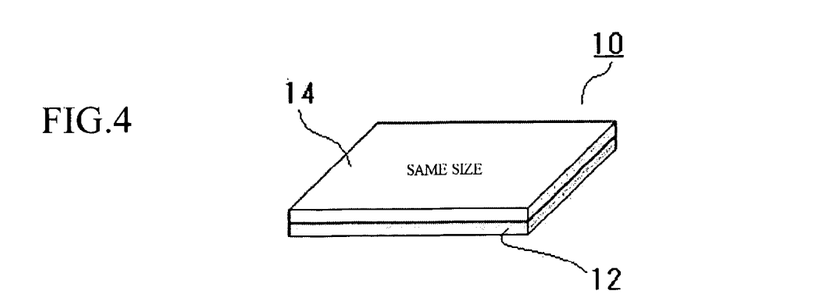
FIG. 4 illustrates a multilayer board having a structure in which a first substrate and a second substrate of the same size are laminated.
Figure 5:
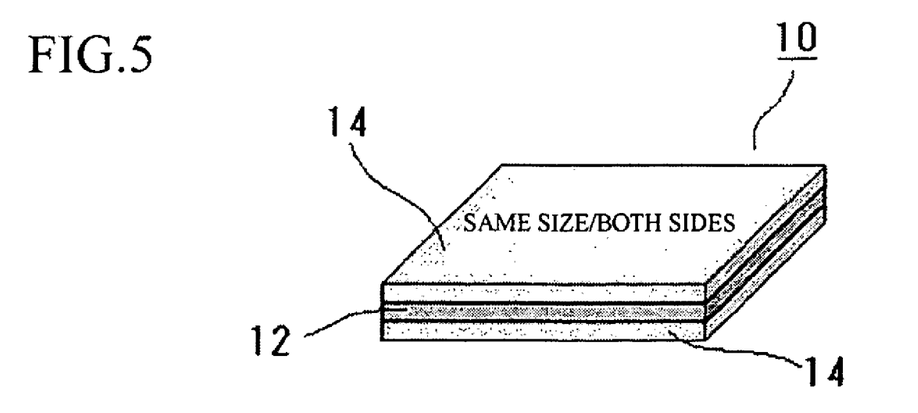
FIG. 5 illustrates a multilayer board having a structure in which second substrates are laminated on the front surface and back surface of a first substrate.
Figure 6:
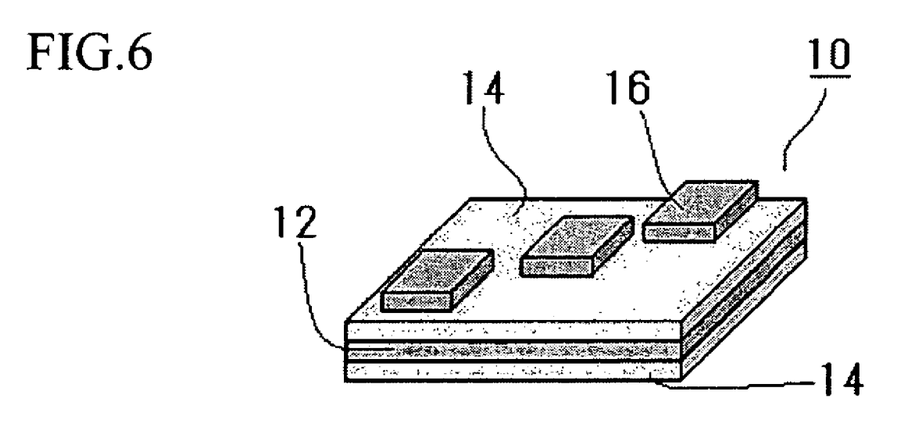
FIG. 6 illustrates a multilayer board having a structure in which third substrates are laminated on the second substrate shown in FIG. 5.

The first substrate 12 may be the same size as that of the second substrate 14. FIG. 4 shows an example of the multilayer board 10 having a structure in which the second substrate 14 having the same size of the first substrate 12 is disposed on a side of the first substrate 12. FIG. 5 shows an example of the multilayer board 10 having a structure in which the second substrates 14 each having the same size of the first substrate 12 are disposed on both sides of the first substrate 12. FIG. 6 shows an example of the multilayer board 10 having a structure in which the third substrates 16 are further disposed on the second substrate 14.

The structure of the lamination of the substrates is not particularly limited thereto.

FIGS. 7A to 7E are process drawings of a process for producing the multilayer board 10 according to a first embodiment.

Figure 7A:
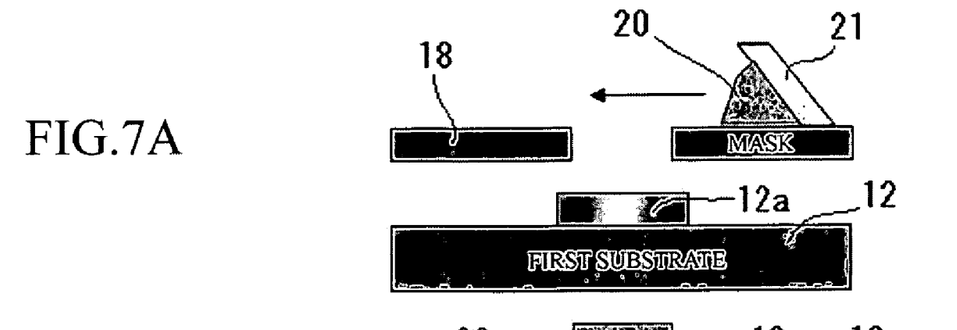
FIGS. 7A to 7E are process drawings of a process for producing a multilayer board according to a first embodiment.
Figure 7B:
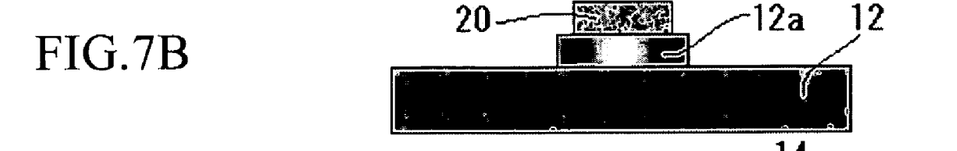

As shown in FIG. 7A, a bonding ink 20 is applied on a terminal 12a of the first substrate 12 by printing with a metal mask 18 using a squeegee 21. FIG. 7B shows a state in which a bonding-ink layer is formed on the terminal 12a.

A protective plating film (not shown) formed of a gold plating film on an underlying nickel film is disposed on the terminal 12a.

The bonding ink 20 including a thermosetting resin, such as an epoxy resin, containing a filler and a curing agent, the filler being formed of metal particles plated with solder, the metal particles each having a first melting point, and the solder having a second melting point lower than the first melting point. The metal particles are preferably copper particles. The solder is preferably composed of a tin-bismuth alloy. The content of the filler is set in such a way that when the thermosetting resin is cured in a heating and pressuring step described below, the metal particles are brought into sufficient contact with each other, and then the solder melts to form an integral structure with sufficient conductivity. The bonding ink 20 serves as a conductive member for electrical connection between the terminals when the multilayer board 10 is completed.

With respect to the curing agent for the epoxy resin, a known curing agent containing a compound having one group selected from a carboxyl group, an amino group, and a phenol group; and an organic acid selected from adipic acid, succinic acid, and sebacic acid may be used.

The thermosetting resin is not limited to the epoxy resin.

Figure 7C:
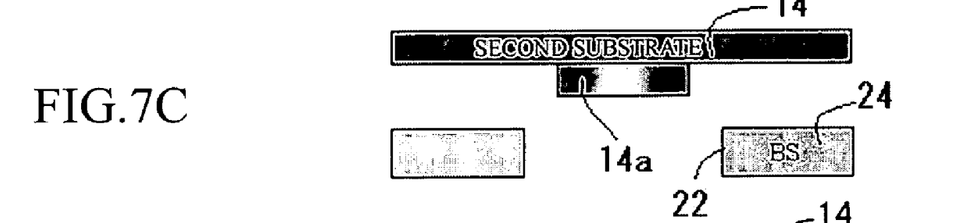
Figure 7D:
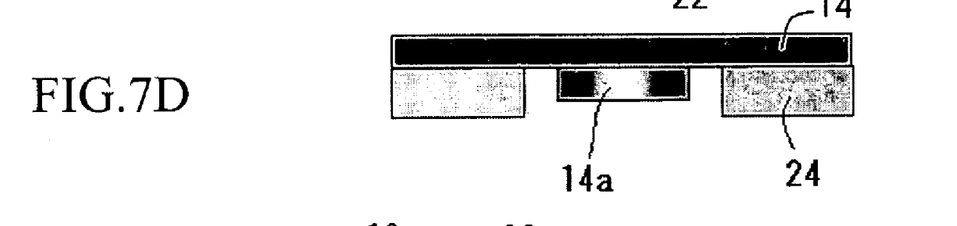

As shown in FIGS. 7C and 7D, a bonding sheet 24 composed of a thermosetting resin and having a through hole 22 disposed in a portion corresponding to a terminal 14a of the second substrate 14 is bonded on the second substrate 14 having the terminal 14a in such a manner that the terminal 14a is located in the through hole 22. The bonding sheet 24 serves as an insulating layer when the multilayer board 10 is completed.

The bonding sheet 24 has tackiness and a sheet of release paper (not shown) attached to each surface thereof. The bonding sheet 24 is perforated to form the through hole 22. The through hole 22 of the bonding sheet 24 has a greater width than the terminal of the second substrate. After one sheet of release paper is peeled, the resulting bonding sheet 24 is bonded to the second substrate 14.

Figure 7E:
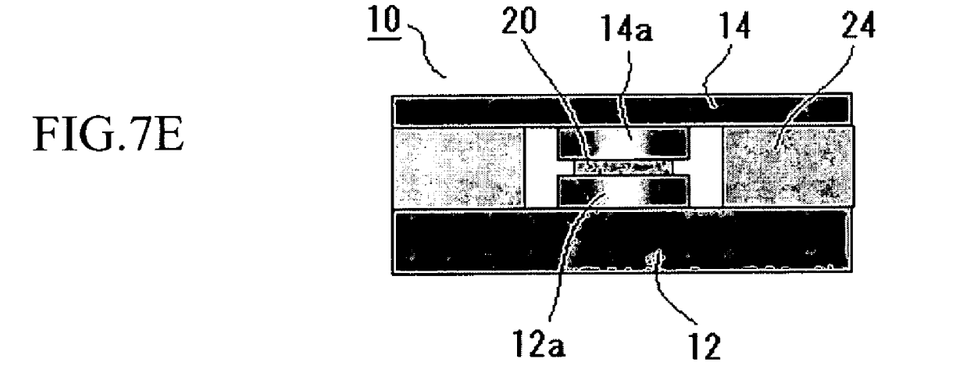

As shown in FIG. 7E, the first substrate 12 and the second substrate 14 with the bonding sheet 24 are positioned using an appropriate positioning member (not shown), such as a pin, in such a manner that the terminals 12a and 14a are opposite each other, and then the first substrate 12 and the second substrate 14 is laminated with the bonding sheet 24 provided therebetween. Of course, the rest of the release paper is peeled before lamination.

Heating and pressurizing the resulting laminate in a vacuum press results in curing of the bonding ink 20 and the bonding sheet 24 to form an integral structure, thereby producing the target multilayer board 10. Since the substrates do not include an electronic component such as semiconductor chip, heating and pressurizing may be performed with the vacuum press.

In the above-described embodiment, the second substrate 14 is laminated on only a side of the first substrate 12. However, the second substrates 14 may be laminated on both sides of the first substrate 12 in the same way as described above.

The multilayer board 10 in which the second substrate 14 is embedded as shown in FIG. 3 may be produced by the same process as that described above, except that a recess (not shown) in which the second substrate 14 is disposed is formed in the first substrate 12.

By heating and pressurizing the laminate as described above, the tin-bismuth solder of the filler in the bonding ink melts to form an integral structure. Furthermore, gold in the protective plating films disposed on the terminals 12a and 14a diffuses to expose nickel film. Nickel is alloyed with the filler to form strong bonding. Thereby, a columnar conductive member is formed, thus resulting in appropriate electrical properties. Moreover, even when substrates having different thermal expansion coefficients are used, the electrical interconnection between terminals of the substrates is ensured because of high bonding strength, thereby improving connection reliability. In addition, since the particles of the filler each include the solder film that melts at a relatively low temperature, heat curing can be performed at a relatively low temperature. This also contributes to the completion of the laminate with low strain of the substrates having different thermal expansion coefficients. Furthermore, since the substrates do not include an electronic component such as a semiconductor chip, it is possible to perform the step of heating and pressurizing the laminate to effect curing of the bonding ink in the production process of the multilayer board, thereby strongly connecting the terminals.

In the embodiment shown in FIGS. 7A to 7E, when the first substrate 12 is referred to as a motherboard, the second substrate 14 is referred to as at least one mounting board.

Alternatively, when the first substrate 12 is referred to as a mounting board, the second substrate 14 is referred to as a motherboard.

Figure 8A:
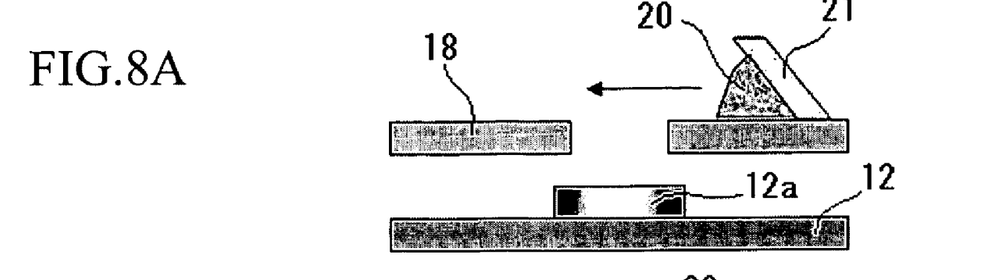
FIGS. 8A to 8D are process drawings of a process for producing a multilayer board according to a second embodiment.
Figure 8B:
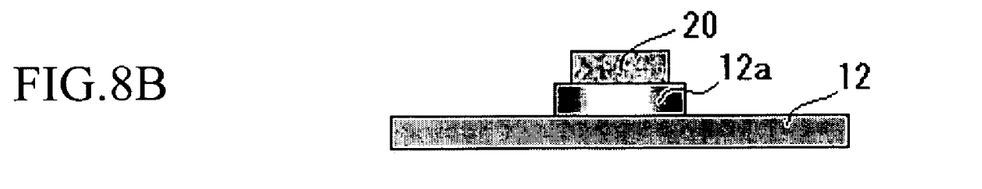
Figure 8C:
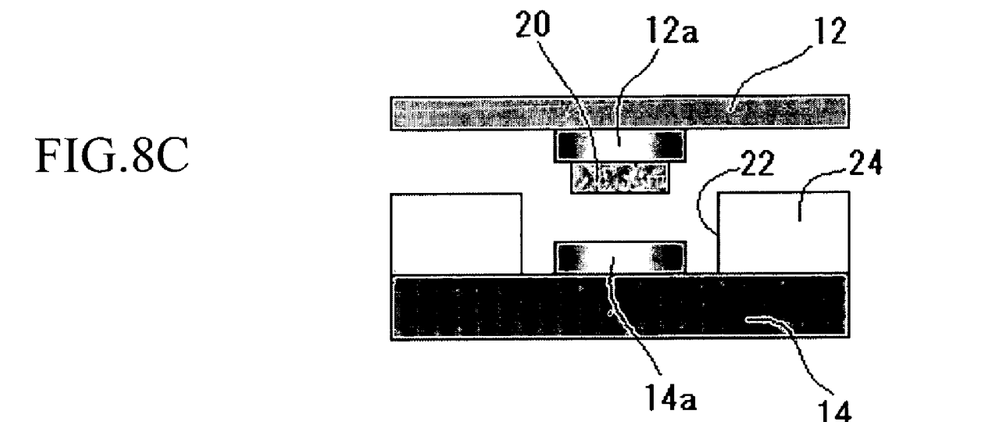
Figure 8D:
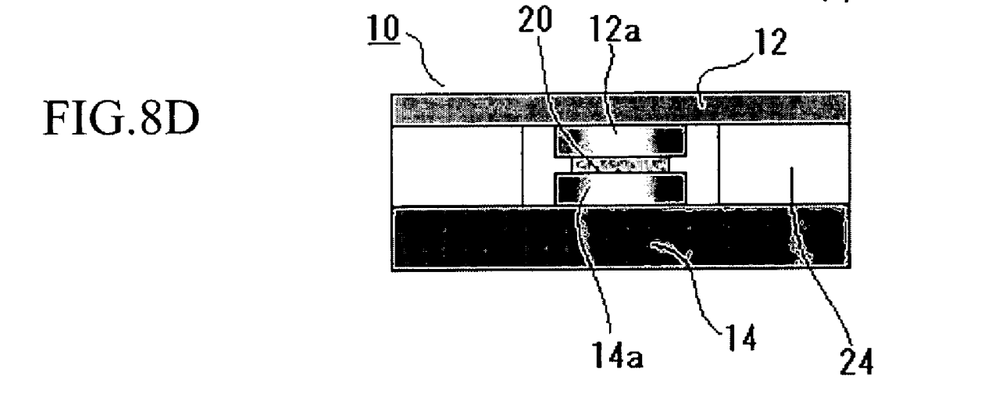

Also in this case, as shown in FIGS. 8A and 8B, the bonding ink 20 is applied on the terminal 12a of the first substrate 12 by printing. As shown in FIG. 8C, the bonding sheet 24 having the through hole 22 is bonded to the second substrate 14 having the terminal 14a. As shown in FIG. 8D, the first substrate 12 and the second substrate 14 with the bonding sheet 24 are positioned in such a manner that the terminals 12a and 14a are opposite each other, and then the first substrate 12 and the second substrate 14 is laminated with the bonding sheet 24 provided therebetween. Heating and pressurizing the resulting laminate results in curing of the bonding sheet 24 and the bonding ink 20 to form the multilayer board 10. In this case, the bonding ink 20 is applied to the terminal 12a of the mounting board 12, and the bonding sheet 24 is bonded to the motherboard 14. That is, this structure is opposite to the structure shown in FIG. 7E.

FIGS. 9A to 9E show a process for producing the multilayer board 10 according to another embodiment.

Figure 9A:
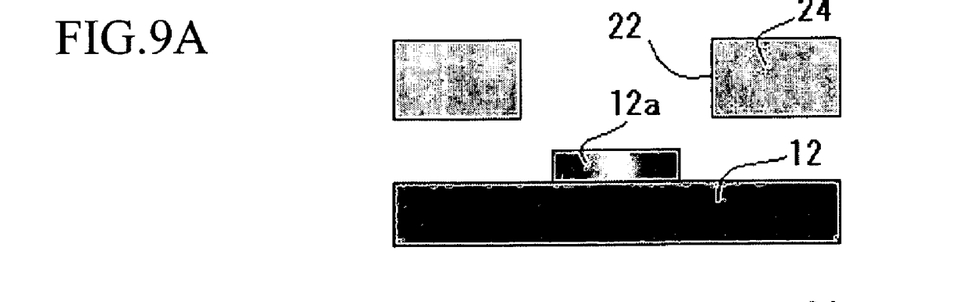
FIGS. 9A to 9E are process drawings of a process for producing a multilayer board according to a third embodiment.
Figure 9B:
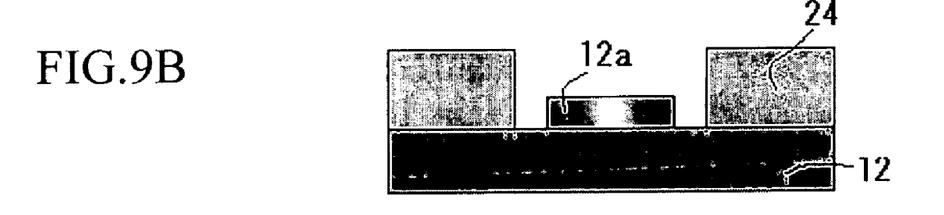

As shown in FIGS. 9A and 9B, the bonding sheet 24 composed of a thermosetting resin and having the through hole 22 disposed in a portion corresponding to the terminal 12a of the first substrate 12 is bonded the first substrate 12 in such a manner that the terminal 12a is disposed in the through hole 22.

Figure 9C:
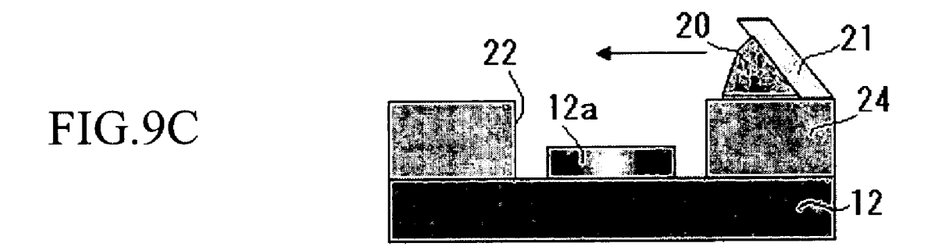
Figure 9D:
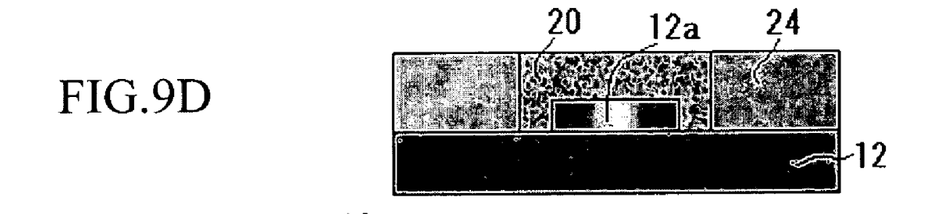

As shown in FIGS. 9C and 9D, the through hole 22 is filled with the bonding ink 20 in such a manner that the terminal 12a is covered with the bonding ink 20, the bonding ink 20 including a thermosetting resin containing a filler and a curing agent, the filler being formed of metal particles plated with solder, the metal particles each having a first melting point, and the solder having a second melting point lower than the first melting point.

Figure 9E:
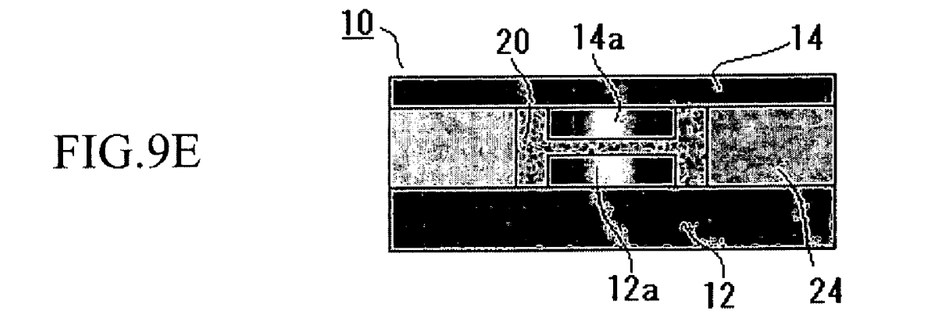

As shown in FIG. 9E, the first substrate 12 with the bonding sheet 24 and the second substrate 14 are positioned in such a manner that the terminals 12a and 14a are opposite each other, and then the first substrate 12 and the second substrate 14 is laminated with the bonding sheet 24 provided therebetween. Heating and pressurizing the resulting laminate results in curing of the bonding sheet 24 and the bonding ink 20 to form an integral structure, thereby producing the multilayer board 10.

Also in this embodiment, it is possible to produce the multilayer board 10 in which the terminal 12a is strongly bonded to terminal 14a.

In the embodiment shown in FIGS. 9A to 9E, when the first substrate 12 is referred to as a motherboard, the second substrate 14 is referred to as at least one mounting board.

Alternatively, when the first substrate 12 is referred to as a mounting board, the second substrate 14 is referred to as a motherboard.

Figure 10A:
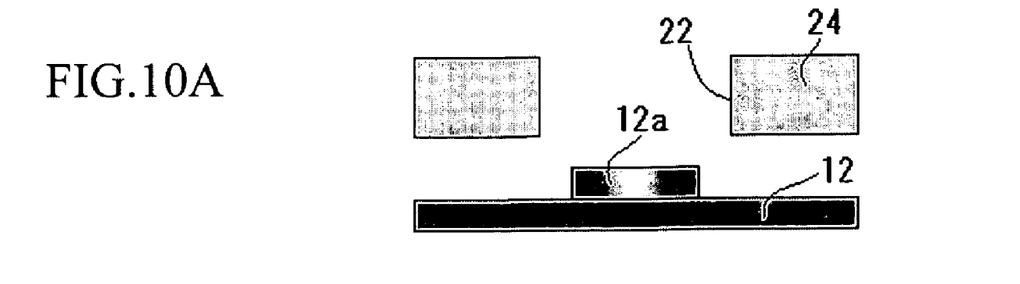
FIGS. 10A to 10E are process drawings of a process for producing a multilayer board according to a fourth embodiment.
Figure 10B:
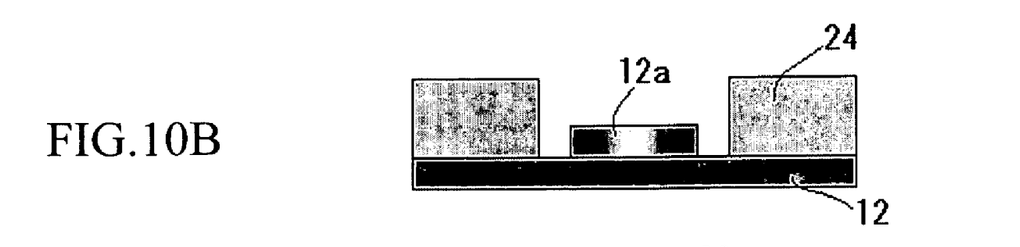

Also in this case, as shown in FIGS. 10A and 10B, the bonding sheet 24 composed of a thermosetting resin and having the through hole 22 disposed in a portion corresponding to the terminal 12a of the first substrate 12 is bonded the first substrate 12 in such a manner that the terminal 12a is disposed in the through hole 22.

Figure 10C:
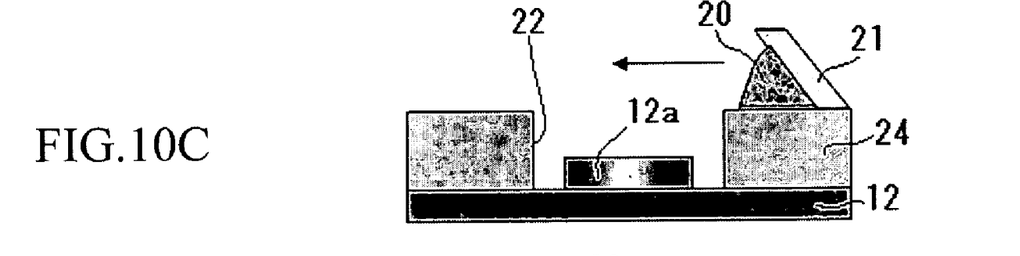
Figure 10D:
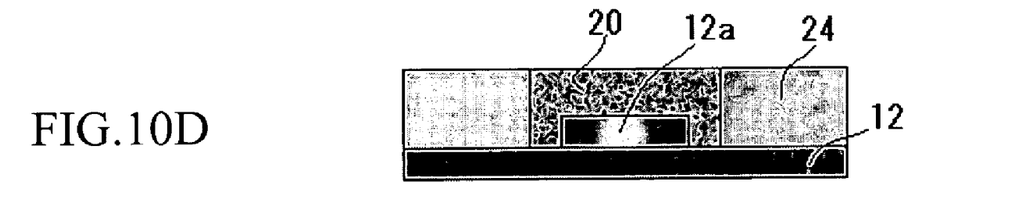

As shown in FIGS. 10C and 10D, the through hole 22 is filled with the bonding ink 20 in such a manner that the terminal 12a is covered with the bonding ink 20, the bonding ink 20 including a thermosetting resin containing a filler and a curing agent, the filler being formed of metal particles plated with solder, the metal particles each having a first melting point, and the solder having a second melting point lower than the first melting point.

Figure 10E:
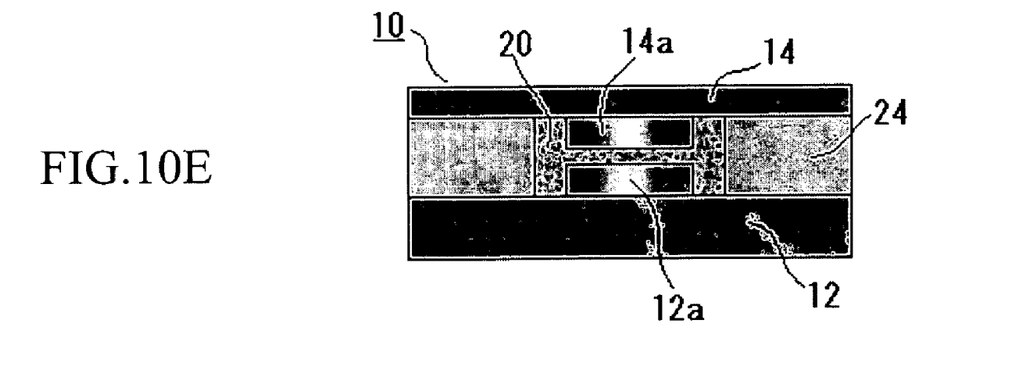

As shown in FIG. 10E, the first substrate 12 with the bonding sheet 24 and the second substrate 14 are positioned in such a manner that the terminals 12a and 14a are opposite each other, and then the first substrate 12 and the second substrate 14 is laminated with the bonding sheet 24 provided therebetween. Heating and pressurizing the resulting laminate results in curing of the bonding sheet 24 and the bonding ink 20 to form an integral structure, thereby producing the multilayer board 10.

In this case, the bonding sheet 24 is bonded to the first substrate 12, and the through hole 22 is filled with the bonding ink 20. That is, this structure is opposite to the structure shown in FIG. 9.

What is claimed is:

1. A process for producing a multilayer board including a first substrate having a terminal which is coated with a protective plating film formed of a gold plating film on an underlying nickel film, a second substrate having a terminal which is coated with a protective plating film formed of a gold plating film on an underlying nickel film, an insulating layer, and a conductive member, the first substrate being bonded to the second substrate with the insulating layer provided therebetween, the terminals being opposite each other and being electrically connected with the conductive member, the process comprising:

applying a bonding ink to the terminal of the first substrate, the bonding ink including a thermosetting resin containing a filler and a curing agent, the filler being formed of copper particles each of which is plated with tin-bismuth solder, the copper particles each having a first melting point, and the tin-bismuth solder having a second melting point lower than the first melting point;

preparing a bonding sheet on which a through hole has been formed;

bonding the bonding sheet to the second substrate in such a manner that the terminal of the second substrate is located in the through hole, the through hole of the bonding sheet having a greater width than the terminal of the second substrate;

positioning the first substrate and the second substrate in such a manner that the terminals thereof are opposite each other and laminating the first substrate and the second substrate with the bonding sheet provided therebetween; and heating and pressuring the resulting laminate to effect curing of the bonding sheet and the bonding ink to form an integral structure, whereby gold in the protective plating films diffuses and nickel in the underlying nickel films is alloyed with the filler to form strong bonding.

2. The process for producing a multilayer board according to claim 1, wherein the first substrate is a motherboard, and the second substrate has a size smaller than that of the motherboard and is at least one mounting board.

3. The process for producing a multilayer board according to claim 1, wherein the second substrate is a motherboard, and the first substrate has a size smaller than that of the motherboard and is at least one mounting board.

4. The process for producing a multilayer board according to claim 1, wherein the bonding sheet has release sheets bonded to the front surface and the back surface of the bonding sheet.

* * * * *